(12) United States Patent
Hsieh et al.

(10) Patent No.: US 7,652,318 B2
(45) Date of Patent: Jan. 26, 2010

(54) SPLIT-GATE MEMORY CELLS AND FABRICATION METHODS THEREOF

(75) Inventors: Chang-Jen Hsieh, Hsinchu (TW); Hung-Cheng Sung, Hsinchu (TW); Wen-Ting Chu, Kaohsiung (TW); Chen-Ming Huang, Hsinchu (TW); Ya-Chen Kao, Hsinchu (TW); Shih-Chang Liu, Kaohsiung (TW); Chi-Hsin Lo, Hsinchu (TW); Chung-Yi Yu, Hsinchu (TW); Chia-Shiung Tsai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 182 days.

(21) Appl. No.: 11/592,290

(22) Filed: Nov. 3, 2006

(65) Prior Publication Data

US 2008/0121975 A1   May 29, 2008

(51) Int. Cl.
*H01L 29/788* (2006.01)
(52) U.S. Cl. ......... 257/315; 257/314; 257/316; 257/324; 257/326; 257/365; 257/366; 257/E21.422; 257/E21.68; 257/E29.129
(58) Field of Classification Search ......... 257/314–316, 257/324, 326, 365, 366, E21.422, E21.68, 257/E29.129
See application file for complete search history.

(56) References Cited

U.S. PATENT DOCUMENTS

| | | | | |
|---|---|---|---|---|
| 5,892,257 A | * | 4/1999 | Acocella et al. | 257/316 |
| 6,084,265 A | * | 7/2000 | Wu | 257/332 |
| 6,091,104 A | | 7/2000 | Chen | |
| 6,291,297 B1 | | 9/2001 | Chen | |
| 6,355,524 B1 | * | 3/2002 | Tuan et al. | 438/257 |
| 6,455,792 B1 | | 9/2002 | Sakaguchi | |
| 6,746,918 B2 | * | 6/2004 | Wu | 438/257 |
| 6,747,310 B2 | | 6/2004 | Fan et al. | |
| 6,784,481 B2 | | 8/2004 | Shin et al. | |
| 6,885,586 B2 | * | 4/2005 | Chen et al. | 365/185.17 |

* cited by examiner

*Primary Examiner*—Andy Huynh
(74) *Attorney, Agent, or Firm*—Birch, Stewart, Kolasch & Birch, LLP

(57) ABSTRACT

Split-gate memory cells and fabrication methods thereof. A split-gate memory cell comprises a plurality of isolation regions formed on a semiconductor substrate along a first direction, between two adjacent isolation regions defining an active region having a pair of drains and a source region. A pair of floating gates are disposed on the active regions and self-aligned with the isolation regions, wherein a top level of the floating gate is equal to a top level of the isolation regions. A pair of control gates are self-aligned with the floating gates and disposed on the floating gates along a second direction. A source line is disposed between the pair of control gates along the second direction. A pair of select gates are disposed on the outer sidewalls of the pair of control gates along the second direction.

15 Claims, 18 Drawing Sheets

SPLIT-GATE MEMORY CELLS AND FABRICATION METHODS THEREOF

BACKGROUND OF THE INVENTION

1. Field of the Invention

The present invention relates to electronic memory devices, and more particularly, to self-aligned split-gate memory cells with stack control gate structures and fabrication methods thereof.

2. Description of the Related Art

Nonvolatile memories, including electrically programmable read only memory (EPROM), electrically erasable programmable read only memory (EEPROM), and flash EEPROM, are currently available in several forms for retaining stored data during periods when no power is applied. In general, there are two basic types of non-volatile memory cell structures: stack gate and split gate. The stack-gate memory cells usually have a floating gate and a control gate, with the control gate being positioned directly above the floating gate. In a split-gate memory cell, the control gate still positioned above the floating gate, but laterally offset from it. A split-gate memory cell usually includes an additional gate known as a select gate which involves relatively complex processing steps.

In the manufacture of a split-gate memory cell, the floating gate pattern is commonly formed with one photolithographic mask, and the control gate or select gate pattern is then defined with another mask. U.S. Pat. Nos. 6,091,104 and 6,291,297, the entirety of which are hereby incorporated by reference, disclose a split-gate memory cell of relatively small size, efficient erasure performance, and relatively small programmable current requirements. The small size is obtained through self-alignment of the select, control and floating gates and the efficiency in erasure is provided by the use of Fowler-Nordheim tunneling from a sharply rounded side edge of the floating gate to the select gate. The programming current is kept small by the use of mid-channel hot carrier injection from the off-gate channel region between the select gate and the floating gate to the sharply curved side edge of the floating gate.

Flash memory cells with separated self-aligned select and erase gates are also disclosed in, for example, U.S. Pat. No. 6,747,310, the entirety of which is hereby incorporated by reference. FIG. 1A is a cross-section of a conventional self-aligned split-gate NOR-type flash memory cell, taken along line 2-2 in FIG. 1B. FIG. 1B is a plan view of the conventional self-aligned split-gate NOR-type flash memory cell. Typically, two memory cells 28 share an erase gate 29. Each cell 28 includes vertically stacked, self aligned floating and control gates 31 and 32. Each memory cell 28 also includes a select gate 33 positioned to one side of the stacked floating and control gates.

Source and drain diffusions 34, 36 are formed in the substrate 49, with programming paths extending from mid-channel regions in the substrate between the select gates and the stacked gates to the edge portions of the floating gates which face the select gates, and erase paths extending from the edge portions of the floating gates which face the erase gates to the source diffusion and to the erase gate.

An oxide layer (not shown) is thermally grown on a monocrystalline silicon substrate 49 which is patterned with strips of field oxide or shallow trench isolation 60 parallel to bit lines 67, as shown in FIG. 1B.

The conventional split-gate memory cell offers self-aligned control gate and floating gate to reduce memory cell space and provide better programming and erasure performance. The conventional floating gate, however, is not self-aligned with shallow trench isolation (STI) and source line (SL), thus hindering further scale-down of highly integrated memory applications.

BRIEF SUMMARY OF THE INVENTION

Accordingly, the invention is directed to split-gate memory cells with floating gates self-aligned with shallow trench insulator (STI) and source lines (SL). In one aspect of the invention, the source line (SL) is formed by forming a source polysilicon plug connected to a source area. In another aspect of the invention, the source line (SL) is formed by etching self-aligned source (SAS) and STI and sequentially implanting dopants to form a continuous source region.

The invention provides a split-gate memory cell, comprising a plurality of isolation regions formed on a semiconductor substrate along a first direction, between two adjacent isolation regions defining an active region having a pair of drains and a source region. A pair of floating gates are disposed on the active regions and self-aligned with the isolation regions, wherein a top level of the floating gate is equal to a top level of the isolation regions. A pair of control gates are self-aligned with the floating gates and disposed on the floating gates along a second direction. A source line is disposed between the pair of control gates along the second direction, and a pair of select gates are disposed on the outer sidewalls of the pair of control gates along the second direction.

In an aspect of the invention, a split-gate memory cell, comprising a plurality of isolation regions formed on a semiconductor substrate along a first direction, between two adjacent isolation regions defining an active region having a pair of drains and a source region is also provided. A pair of floating gates are disposed on the active regions and self-aligned with the isolation regions, wherein a top level of the floating gate is equal to a top level of the isolation regions. A pair of control gates are self-aligned with the floating gates and disposed on the floating gates along a second direction. A source line directly connects the source region and is disposed between the pair of control gates along the second direction. A pair of select gates are disposed on the outer sidewalls of the pair of control gates along the second direction.

In another aspect of the invention, a split-gate memory cell, comprising a plurality of isolation regions formed on a semiconductor substrate along a first direction, between two adjacent isolation regions defining an active region having a pair of drains and a source region is further provided. A pair of floating gates are disposed on the active regions and self-aligned with the isolation regions, wherein a top level of the floating gate is equal to the top level of the isolation regions. A pair of control gates are self-aligned with the floating gates and disposed on the floating gates along a second direction. A source line electrically connects a continuous doped region and is disposed between the pair of control gates along the second direction, wherein the source line does not directly contact the source region. A pair of select gates are disposed on the outer sidewalls of the pair of control gates along the second direction.

The invention further provides a method for fabricating a split-gate memory cell, comprising providing a semiconductor substrate with a plurality of isolation regions along a first direction, between two adjacent isolation regions defining an active region. A pair of floating gates are formed on the active regions and self-aligned with the isolation regions, wherein a top level of the floating gate is equal to the top level of the isolation regions. An oxide-nitride-oxide (ONO) layer, a polysilicon layer, and an oxide layer are sequentially deposited on the semiconductor substrate. A pair of control gate stacks are defined along a second direction, thereby self-aligning with the pair of floating gates. A source line is formed between the pair of control gates and simultaneously a pair of select gates are formed on the outer sidewalls of the pair of control gates along the second direction.

BRIEF DESCRIPTION OF DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention is directed to split-gate non-volatile memory cells with a floating gate (FG) self-aligned with shallow trench insulators (STI) along a first direction. A control gate (CG) is defined by lithography and self aligned with the floating gate. Moreover, the floating gate is self-aligned with a source line along a second direction. In one aspect of the invention, the source line is formed by a polysilicon source plug directly connected to a source region. In another aspect of the invention, the source line is formed by a self-aligned source (SAS) procedure in associated with an SAS-STI etching procedure, and followed by source line implantation. Parenthetically, note that the select gate (SG) is defined by CG/FG spacers and self-aligned with FG.

Figure 1A:
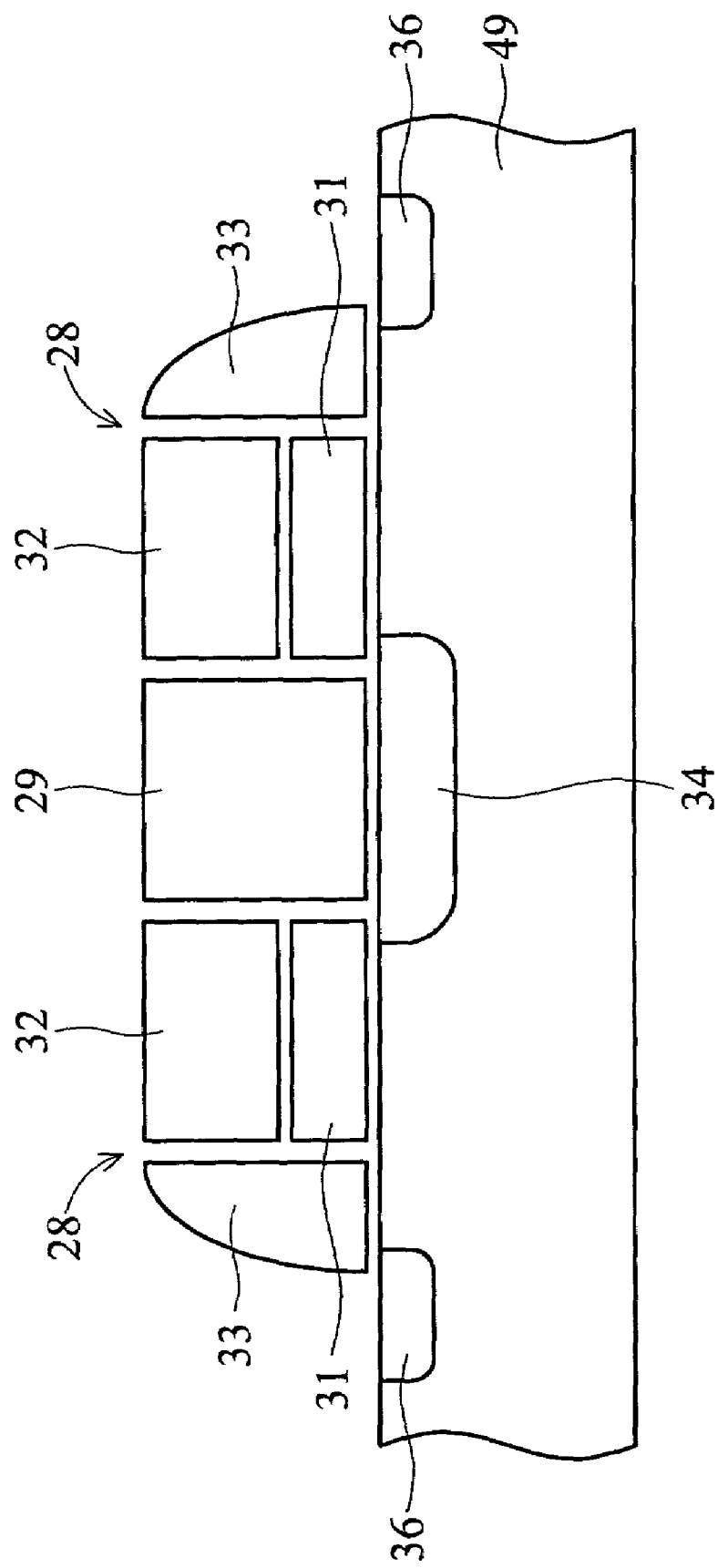
FIG. 1A is a cross section of a conventional self-aligned split-gate NOR-type flash memory cell, taken along line 2-2 in FIG. 1B.
Figure 1B:
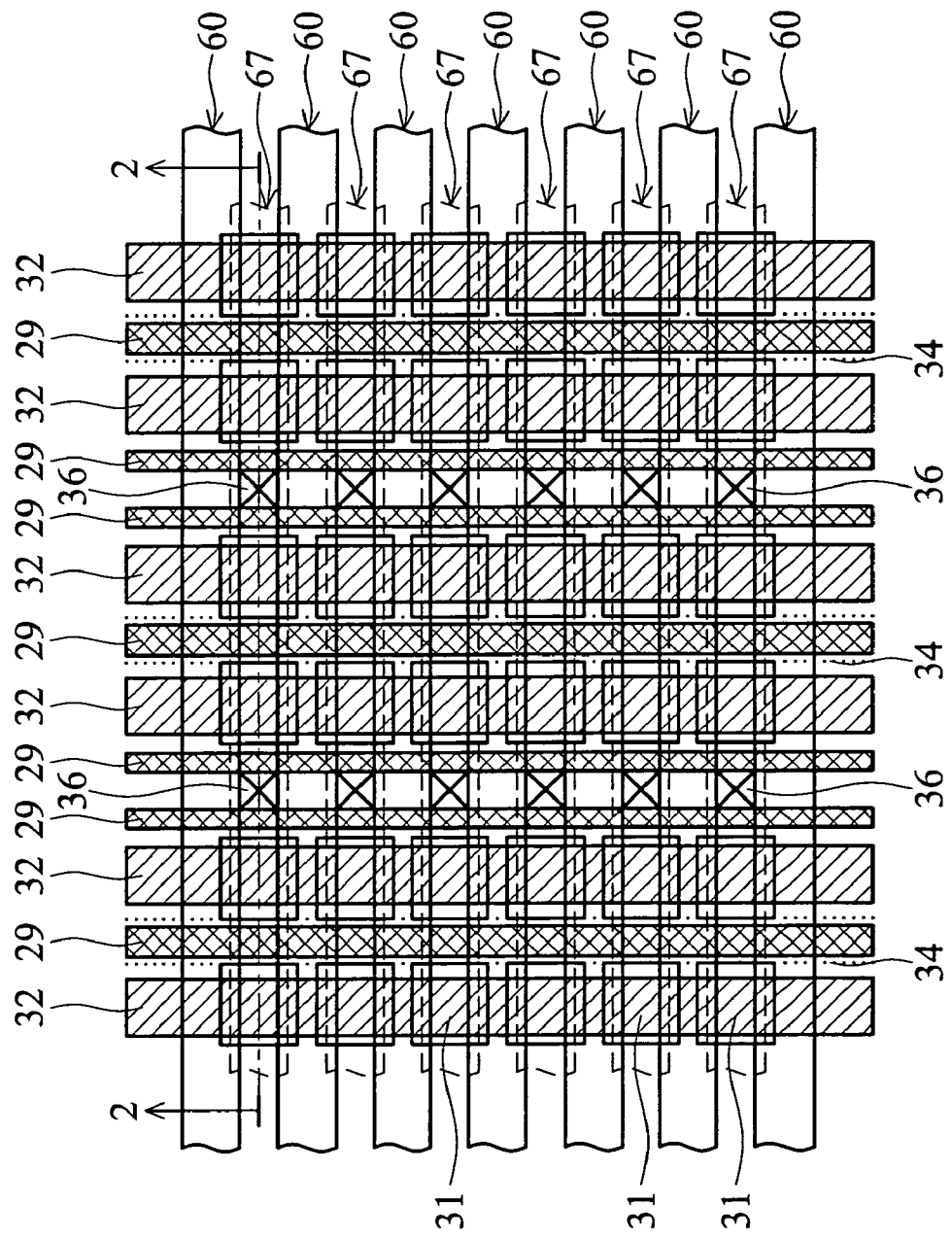
FIG. 1B is a plan view of the conventional self-aligned split-gate NOR-type flash memory cell.
Figure 2A:
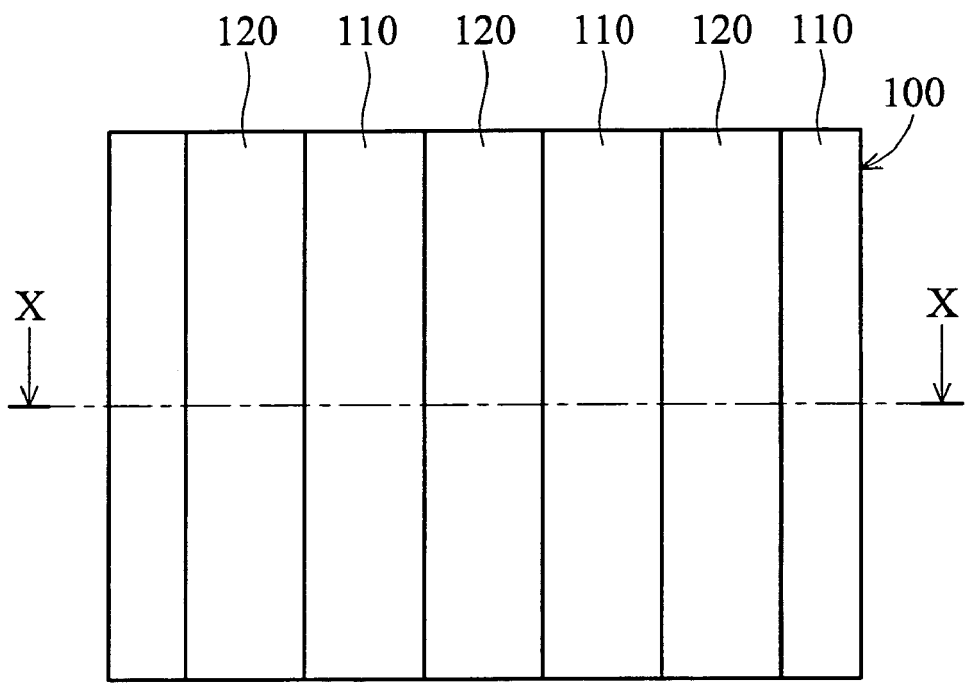
FIG. 2A is a plan view of a semiconductor substrate with adjacent isolation regions along a first direction.
Figure 2B:
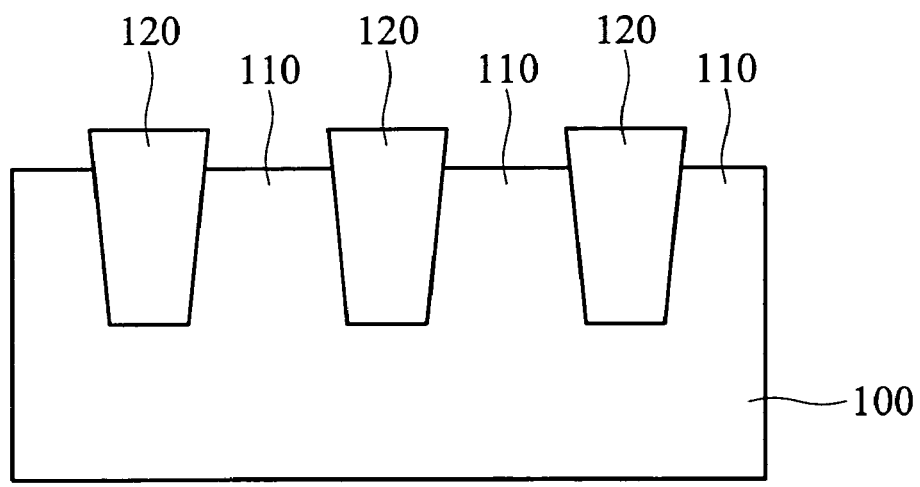
FIG. 2B is a cross section of the semiconductor taken along line X-X of FIG. 2A.

FIG. 2A is a plan view of a semiconductor substrate with adjacent isolation regions along a first direction. FIG. 2B is a cross section of the semiconductor taken along line X-X of FIG. 2A. Referring to FIG. 2A, a semiconductor substrate 100, such as a P type semiconductor substrate, comprised of a single crystalline silicon wafer with a <100> crystallographic orientation, is provided. A plurality of parallel adjacent isolation regions 120 are formed on a semiconductor substrate 100 along a first direction. An active region 110 is defined between the adjacent isolation regions 120. Isolation regions 120, either silicon oxide, shallow trench isolations (STI), or silicon dioxide, or field oxide regions (FOX), are formed to define electrically separated active regions 110. The top level of the active region 110 is lower than the top level of the isolation region 120.

Figure 2C:
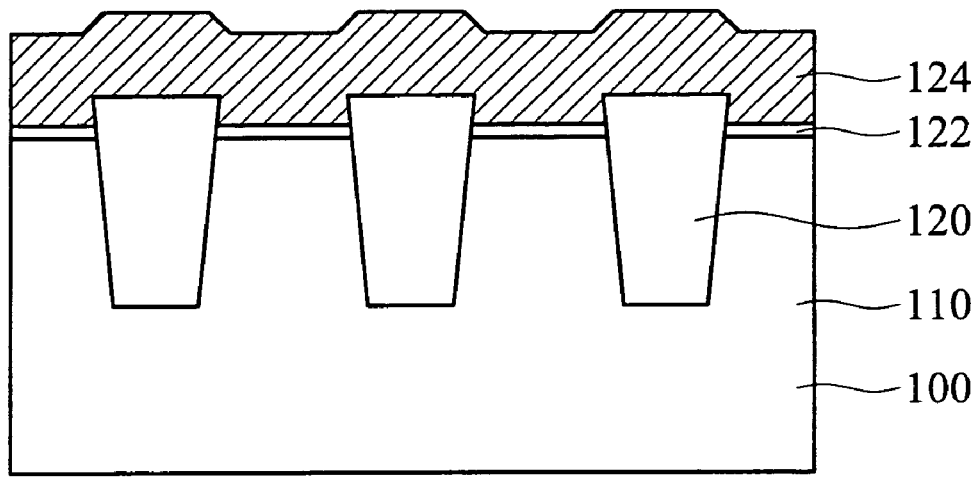
FIGS. 2C-2D are plan views of forming an oxide layer and a polysilicon layer on the semiconductor substrate taken along line Y-Y of FIG. 2A.
Figure 2D:
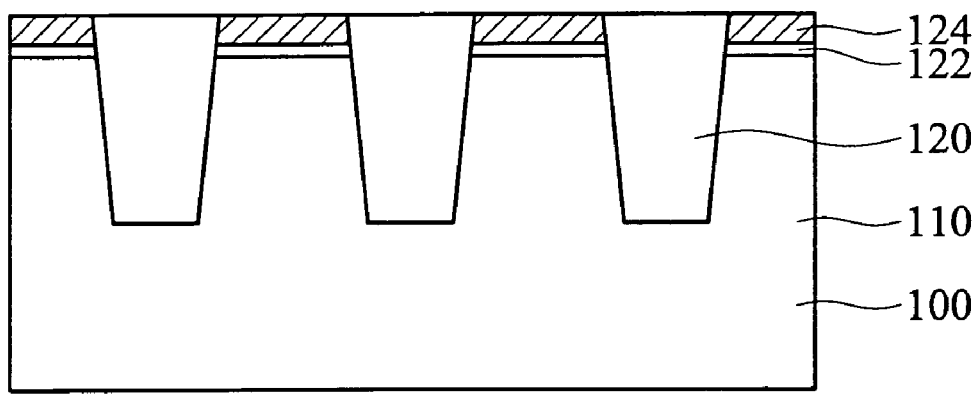

FIG. 2C is a plan view of forming an oxide layer and a polysilicon layer on the semiconductor substrate. In FIG. 2C, an oxide layer 122 is formed on the substrate 100. The oxide layer 122 can be obtained using rapid process oxidation (RPO) or obtained via low pressure chemical vapor deposition (LPCVD) or plasma enhanced chemical vapor deposition (PECVD) procedures. A polysilicon layer 124, such as a $PH_3$-doped polysilicon, can be formed by chemical vapor deposition (CVD). The semiconductor substrate 100 is sequentially planarized by chemical mechanical planarization (CMP) partially leaving the oxide layer 122 and the polysilicon layer 124 on the active region 110 and exposing the isolation regions 120. The oxide layer 110 and polysilicon layer 120 on the active region 120, due to being formed in this manner, are thus self-aligned with and parallel to the isolation regions 120 along the first direction and serve as a floating gate (FG) of the memory cell as shown in FIG. 2D.

Figure 2E:
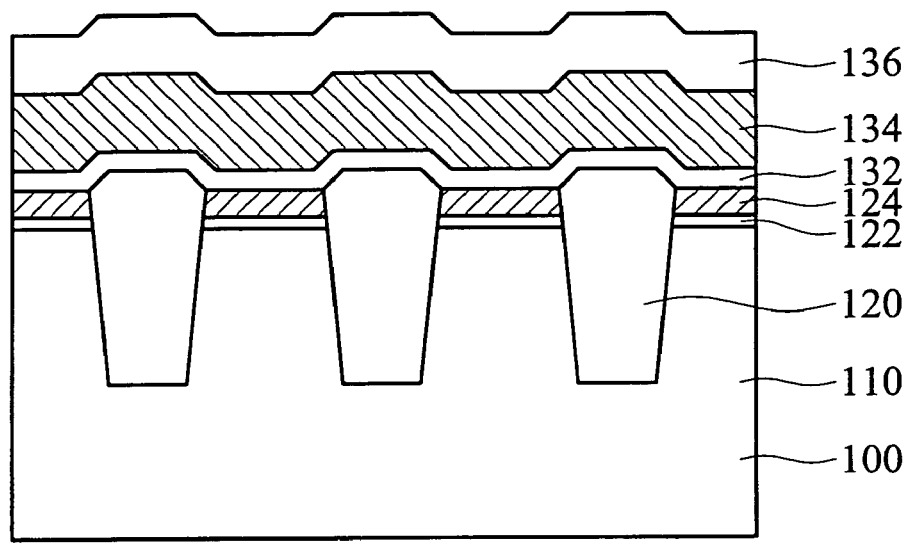
FIG. 2E is a plan view of forming an oxide-nitride-oxide (ONO) stack layers on the semiconductor substrate.

FIG. 2E is a plan view of forming an oxide-nitride-oxide (ONO) stack layers on the semiconductor substrate. A stack layer comprising a first silicon oxide layer, a silicon nitride layer and a second oxide layer (ONO) 132 are sequentially deposited on the semiconductor substrate 100. The ONO stack layer 132 preferably consists of a bottom layer of oxide having a thickness of 30-100 Å, a central layer of nitride having a thickness of 50-300 Å, and a top layer of oxide having a thickness of 30-100 Å. Next, a polysilicon layer 134 is formed on the semiconductor substrate 100. The polysilicon layer 134 can be doped in situ during deposition, via the addition of arsine or phosphine to a silane ambient. Alternatively, the polysilicon layer 134 can be deposited intrinsically then doped via implantation of arsenic or phosphorous ions. An oxide layer or an anti-reflection coating (ARC) layer 136 is formed on the polysilicon layer 134.

Figure 2F:
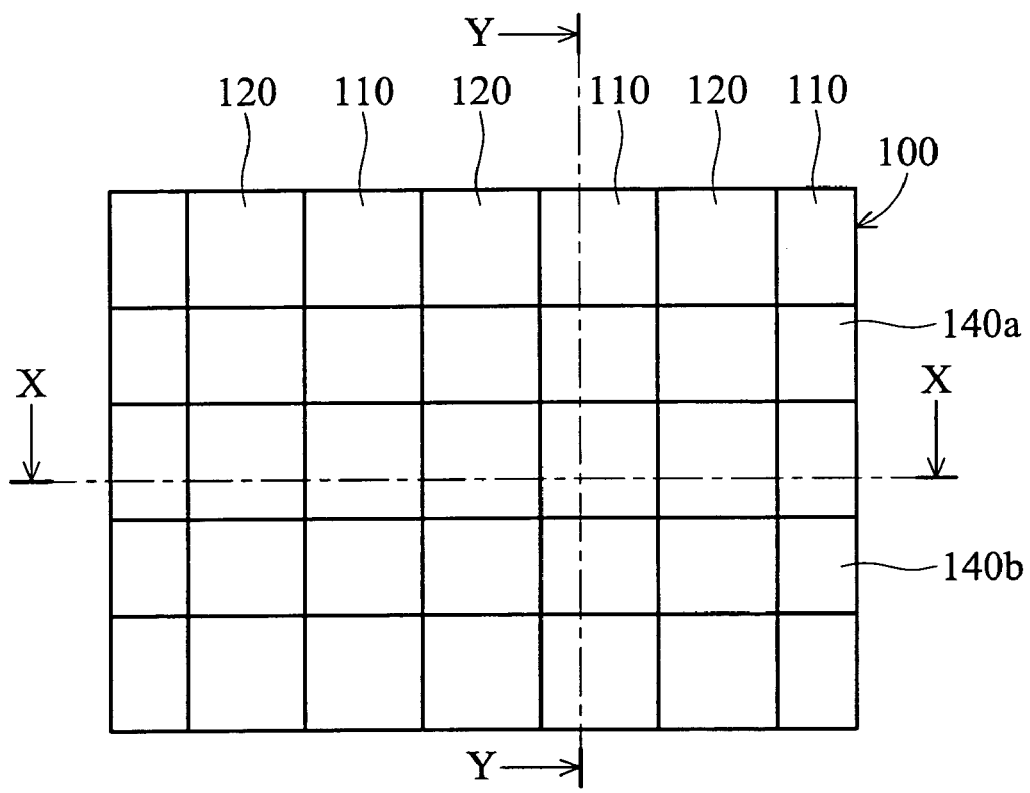
FIG. 2F is a plan view of a semiconductor substrate with the polysilicon layer 134 and the ARC layer 136 patterned along a second direction.
Figure 2G:
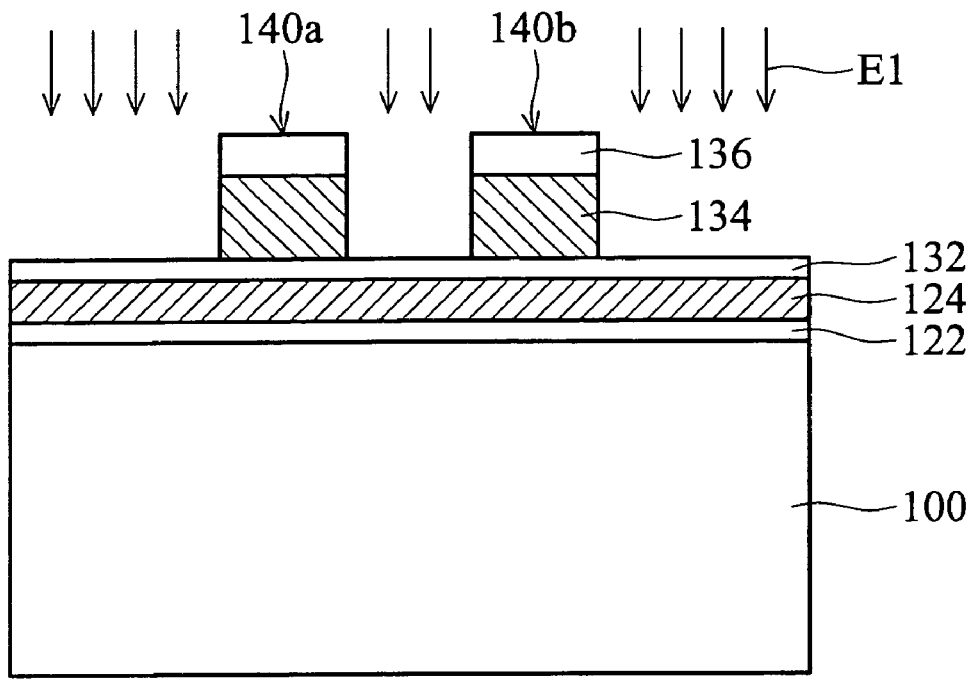
FIG. 2G is a cross section of the semiconductor substrate taken along line Y-Y of FIG. 2F.
Figure 2H:
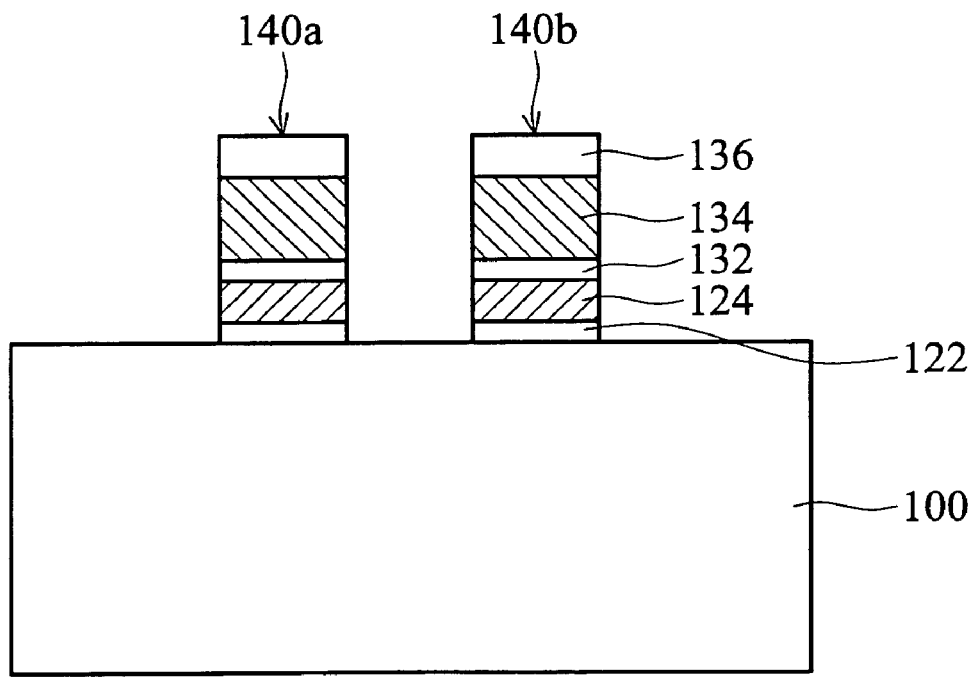
FIG. 2H is a cross section of an exemplary embodiment of the pair of stack structures and including the control gates self aligned with the floating gates.

FIG. 2F is a plan view of a semiconductor substrate with the polysilicon layer 134 and the ARC layer 136 patterned along a second direction. FIG. 2G is a cross-section of the semiconductor substrate taken along line Y-Y of FIG. 2F. The ARC layer 136 and the polysilicon layer 134 are patterned by performance an anisotropic etching procedure along the second direction, such as a reactive ion etching (RIE) procedure, using etchant such as $Cl_2$ or $SF_6$. The ONO stack layer 134 is subsequently etched E1 along the second direction. A pair of stack structures 140a and 140b are thus formed along the second direction to serve as control gates (CG) of the split-gate memory cell. The pair of stack structures 140a and 140b including the control gates self aligned with the floating gates are shown in FIG. 2H.

In one aspect of the invention, source lines of the split gate memory cell can be formed by a polysilicon source plug directly connected to a source region.

Figure 3A:
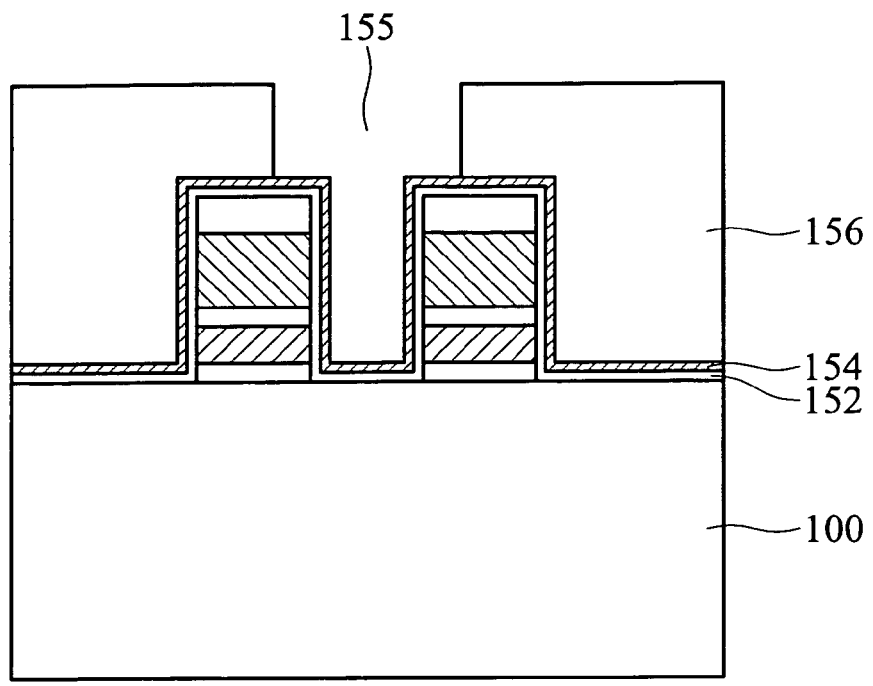
FIG. 3A is a cross section showing formation of an oxide layer and a nitride layer on the semiconductor substrate.

FIG. 3A is a cross section showing formation of an oxide layer and a nitride layer on the semiconductor substrate. In FIG. 3A, a thin oxide layer 152 and a nitride layer 154 are conformably formed on the semiconductor substrate 100. A photoresist layer 156 is formed on the nitride layer 154. An opening 155 is lithographically developed in the photoresist layer 152 exposing a portion of the pair of the stacks 140a and 140b and a region therebetween.

Figure 3B:
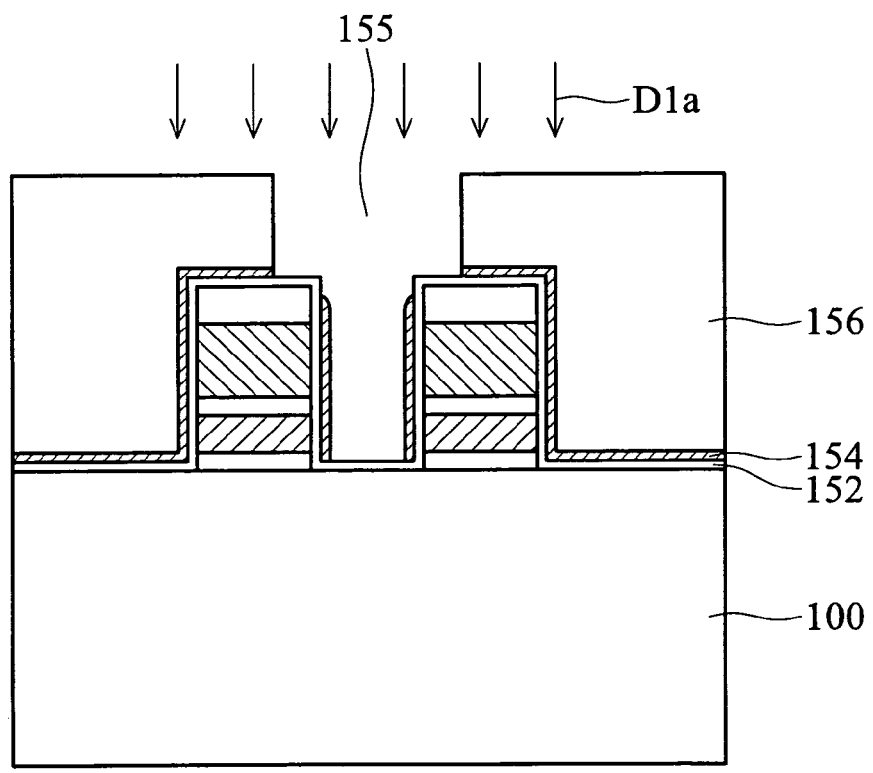
FIGS. 3B-3C are cross sections showing an anisotropic etching performed on the semiconductor substrate.
Figure 3C:
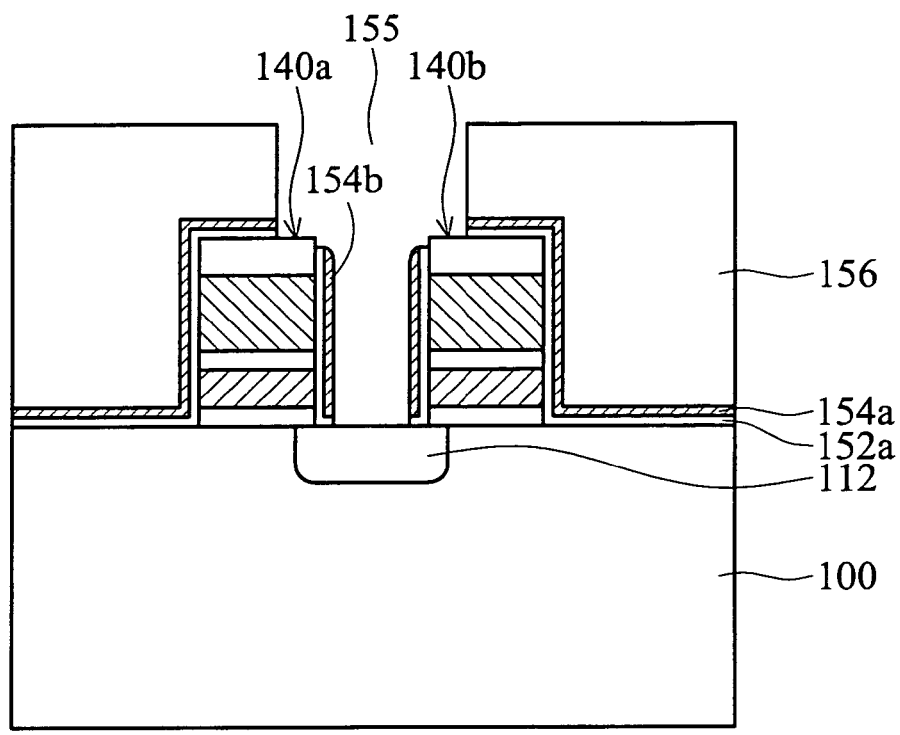

FIG. 3B is a cross section showing an anisotropic etching performed on the semiconductor substrate. An anisotropic etching, such as reactive ion etching (RIE) is performed on the semiconductor substrate 100 removing a portion of the nitride layer 154. The top surface of the oxide layer 152 on the stack structures is thus exposed. Ion implantation D1a is sequentially performed to implant dopants into the semiconductor substrate 100 to create a source region 112. The exposed oxide layer 152 is further etched exposing the surface of the source region 112 and a portion of the pair of stacks 140a and 140b as shown in FIG. 3C.

Figure 3D:
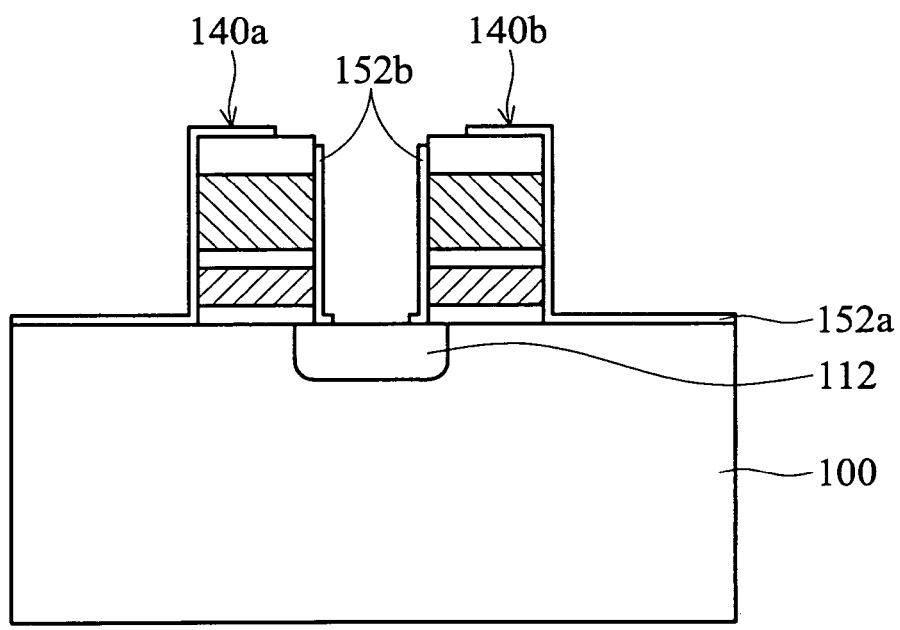
FIG. 3D is a cross section showing removal of the patterned photoresist layer from the semiconductor substrate.

FIG. 3D is a cross section showing removal of the patterned photoresist layer from the semiconductor substrate. In FIG. 3D, the patterned photoresist layer 156 is stripped from the semiconductor substrate 100. The nitride layer 154 is sequentially removed leaving oxide layer 152a on the semiconductor substrate 100.

Figure 3E:
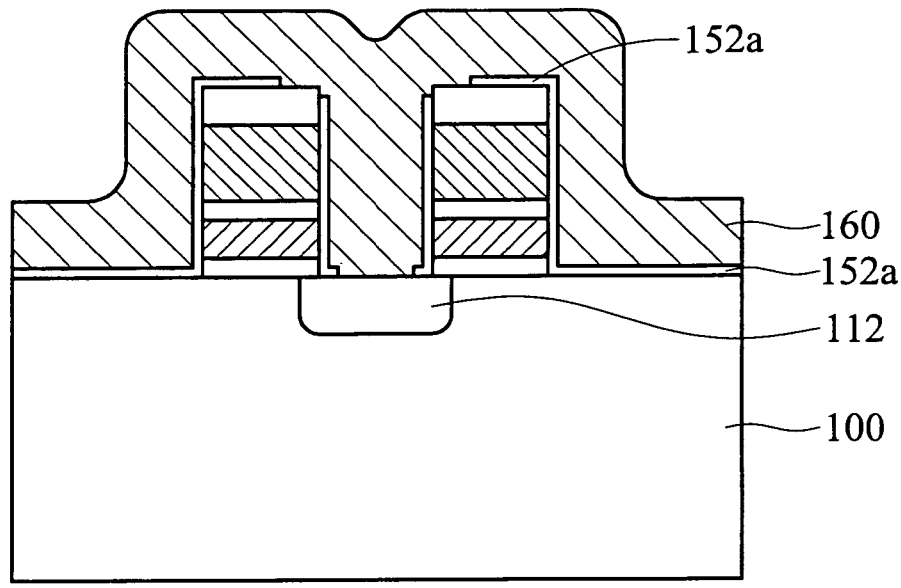
FIG. 3E is a cross section showing deposition of a polysilicon layer on the semiconductor substrate.

FIG. 3E is a cross section showing deposition of a polysilicon layer on the semiconductor substrate. A polysilicon layer 160 is conformably formed on the semiconductor substrate 100. The polysilicon layer 160 can be doped in situ during deposition, via the addition of arsine or phosphine to a silane ambient. Alternatively, the polysilicon layer 160 can be deposited intrinsically then doped via implantation of arsenic or phosphorous ions.

Figure 3F:
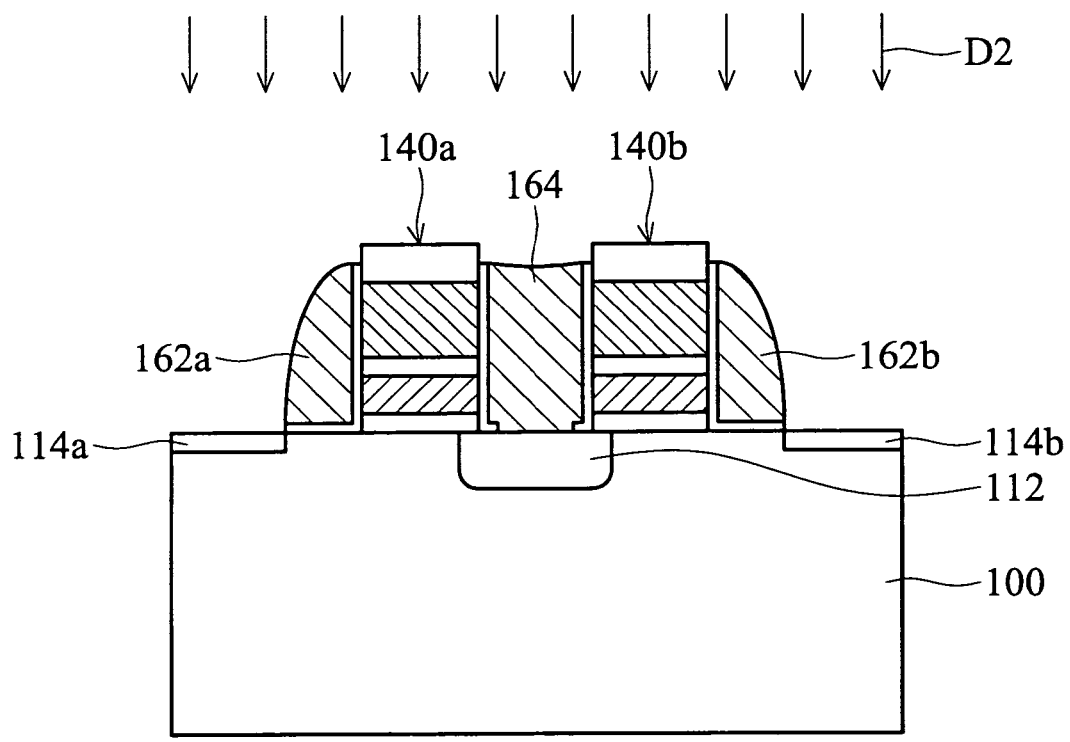
FIG. 3F is a cross section showing creation of source lines and selected gates on the semiconductor substrate.

FIG. 3F is a cross section showing creation of source lines and selected gates on the semiconductor substrate. An anisotropic etching such as RIE is employed to create a source line (SL) 164 between the pair of control gates 140a and 140b along the second direction. The source line 164 is a polysilicon source plug directly connected to the source region 112. A pair of select gates 162a and 162b are simultaneously created on the outer sidewalls of the pair of control gates 140a and 140b along the second direction. Parenthetically note that the floating gates (FG) are self-aligned with the source line (SL). A pair of light doped drain/source (LDD) 114a and 114b are formed in the semiconductor substrate 100 by ion implantation D2.

Figure 3G:
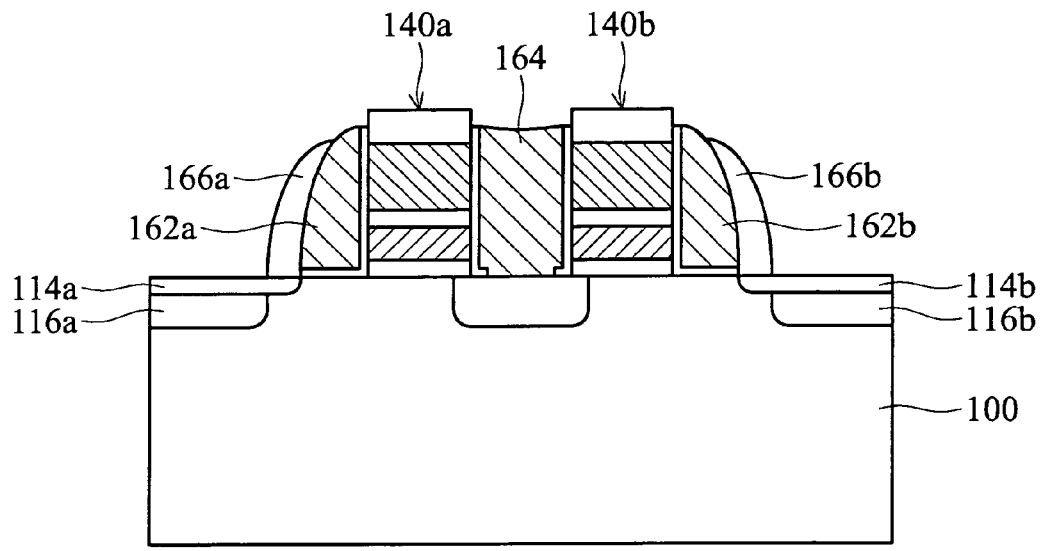
FIG. 3G is a cross section showing formation of dielectric spacers on the sidewalls of the select gates.

FIG. 3G is a cross section showing formation of dielectric spacers on the select gates. A dielectric layer is conformably formed on the semiconductor substrate 100 and anisotropically etched partially leaving dielectric spacers 166a and 166b on the select gates 162a and 162b. A critical anisotropic etching back procedure is performed via RIE procedures terminated at the point in which the portion of dielectric spacers 166a and 166b residing on the sidewall of the select gates 162a and 162b.

An ion implantation is subsequently performed to create a pair of highly doped drain/source (HDD) regions 116a and 116b in the semiconductor substrate 100. For example, an ion implantation procedure is preferably performed, using arsenic or phosphorous ions at a doping energy between about 35 to 50 KeV, at a dose between about $1\times10^{14}$ and $6\times10^{15}$ atoms/$cm^2$, forming heavily doped, N type drain regions 116a and 116b in areas not covered by the control gate and dielectric spacers structures.

Figure 3H:
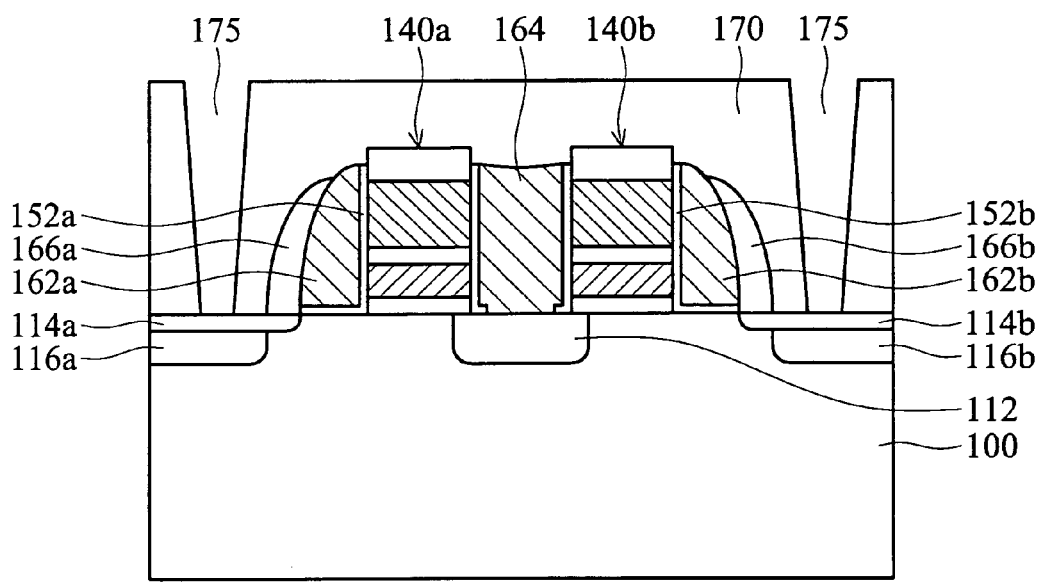
FIG. 3H is a cross section showing formation of an interlayer dielectric (ILD) on the semiconductor substrate.

FIG. 3H is a cross section showing formation of an interlayer dielectric (ILD) on the semiconductor substrate. In FIG. 3H, an ILD layer 170 is patterned forming openings 175 exposing the drain regions 116a and 116b.

Figure 3I:
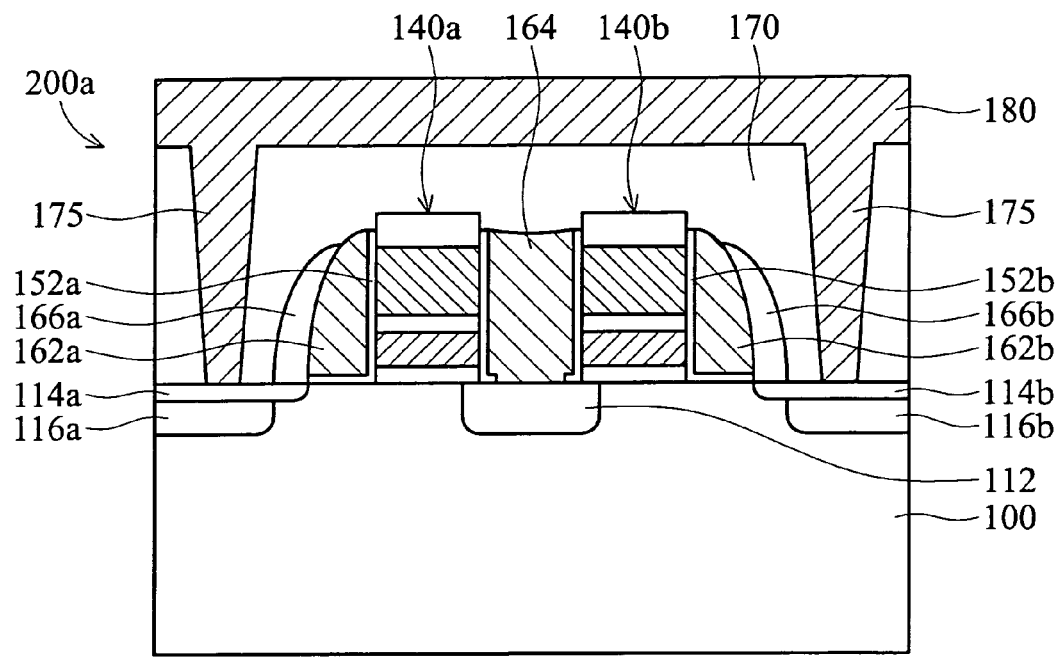
FIG. 3I is a cross section showing metallization of bit lines and contact plugs of the split-gate memory.

FIG. 3I is a cross section showing metallization of bit lines and contact plugs of the split-gate memory. A metal layer 180 is formed on the ILD layer 170 filling the opening 175 to serve as metal contact. For example, metallization is subsequently applied and etched to form bit lines 180 and self-aligned bit line contacts 185.

Figure 3J:
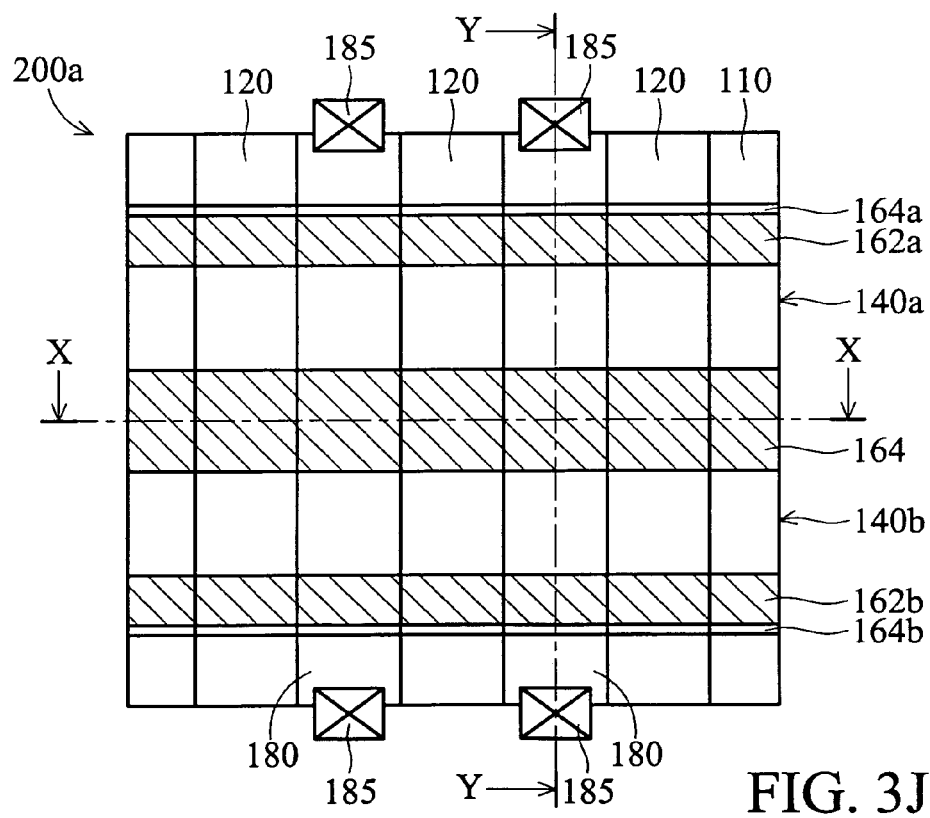
FIG. 3J is a plan view of a split-gate memory cell according to an embodiment of the invention.

Accordingly, in an aspect of the invention, a split-gate nonvolatile memory cell 200a is thus provided. Adjacent isolation regions 120 are formed on a semiconductor substrate 100 along a first direction. The adjacent isolation regions 120 define an active region 110 having a pair of drains 116a, 116b and a source region 112, wherein the top level of the active region 110 is lower than the top level of the isolation regions 120. A pair of floating gates 124 is disposed on the active regions and self-aligned with the isolation regions, whereby the top level of the floating gate is equal to the top level of the isolation regions. A pair of control gates 134 are self-aligned with the floating gates 124 and disposed on the floating gates along a second direction. A source line 164 is a polysilicon source plug directly connected to the source region 112, and is disposed between the pair of control gates 134 along the second direction. A pair of select gates 162a and 162b are disposed on the outer sidewalls of the pair of control gate stacks along the second direction, wherein the floating gates are self-aligned with the source line, as shown in FIG. 3J.

In another aspect of the invention, the source line is a self aligned source (SAS) formed by STI etching and source line implantation.

Figure 4A:
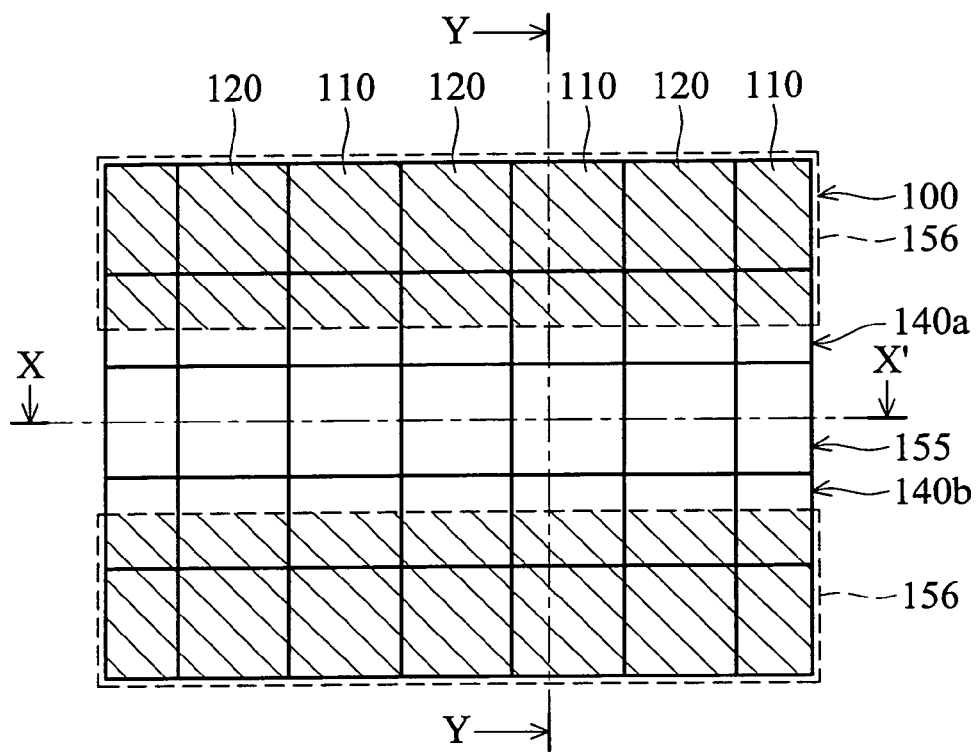
FIG. 4A is a plan view of the stacked pairs of floating gates and control gates on the semiconductor substrate.
Figure 4B:
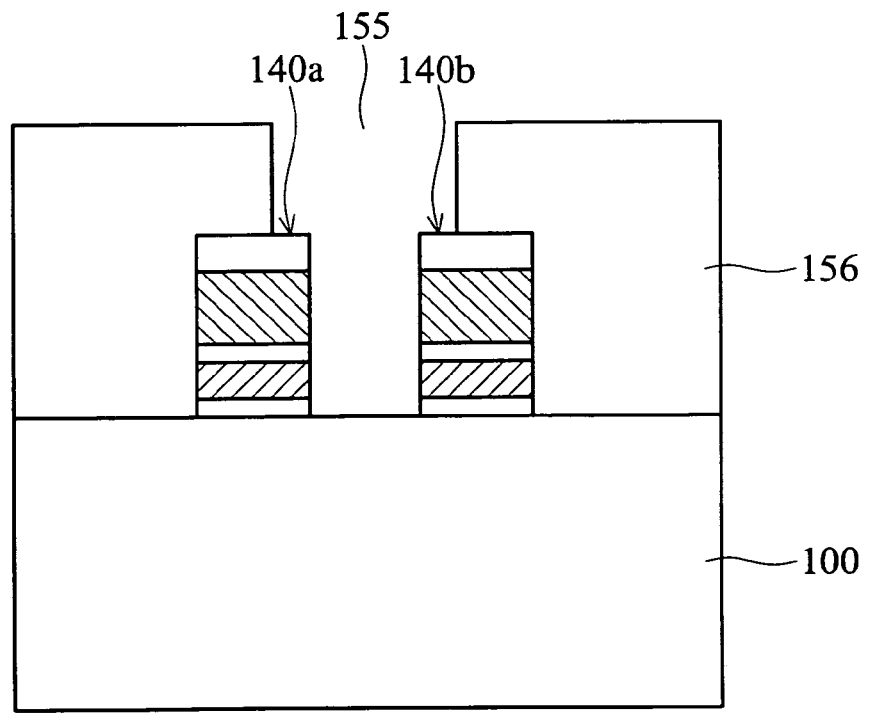
FIG. 4B is a cross section taken along line Y-Y of FIG. 4A.

FIG. 4A is a plan view of the stacked pairs of floating gates and control gates on the semiconductor substrate. FIG. 4B is a cross section taken along line Y-Y of FIG. 4A. The process of FIG. 4B is generally similar to the process of FIGS. 2A-2K and for simplicity its detailed description is omitted. A photoresist layer 156 is formed on the semiconductor substrate 100 and lithographically developed exposing a portion 155 of the pair of the stack structures 140a, 140b and regions therebetween.

Figure 4C:
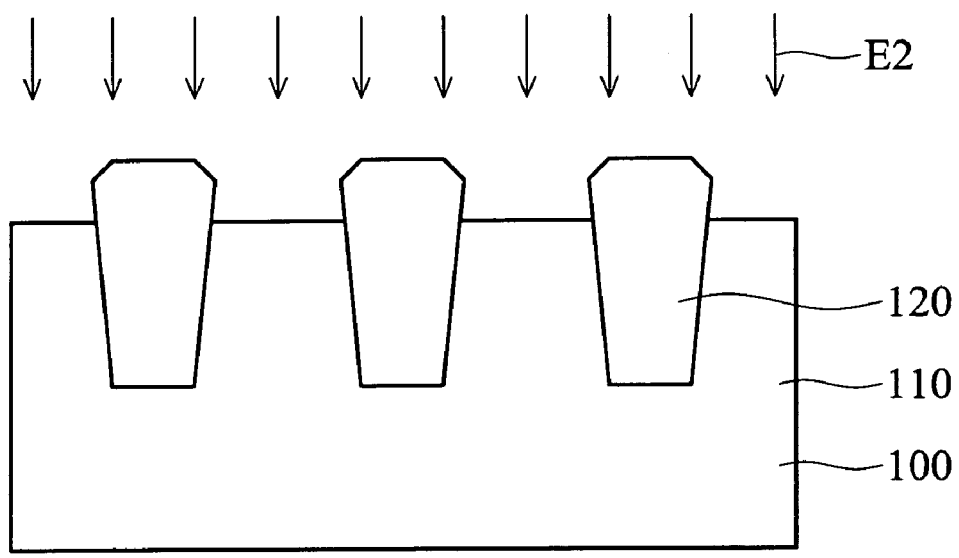
FIG. 4C is a cross section showing an etching procedure performed on the semiconductor substrate of FIG. 4A taken along line X-X.

FIG. 4C is a cross section showing an etching procedure performed on the semiconductor substrate taken along line X-X of FIG. 4A. An anisotropic etching E2 such as wet etching, dry etching or ion reactive dry etching (RIE) is performed to remove the shallow trench insulator (STI) regions 120. For example, the shallow trench insulator (STI) regions 120 can be removed by diluted HF solution or buffered oxide etching (BOE) to expose the surface of the semiconductor substrate 100.

Figure 4D:
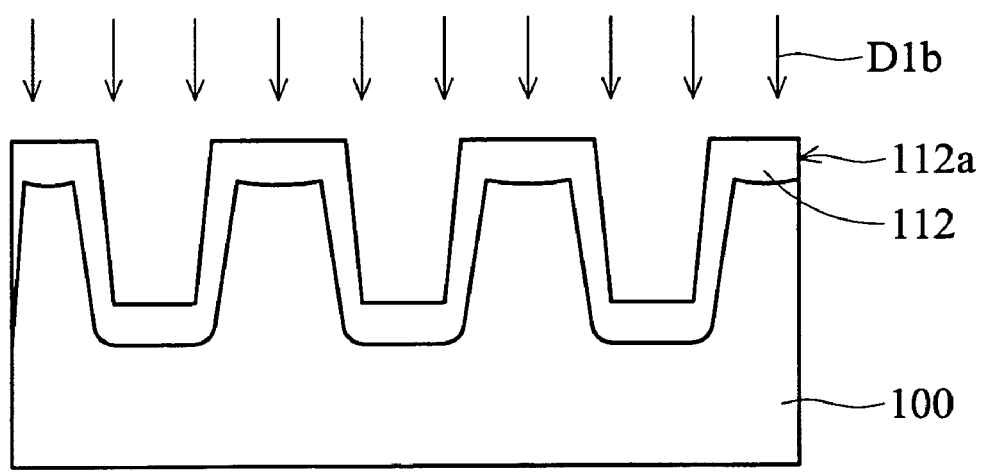
FIG. 4D is a cross section showing an ion implantation performed on the semiconductor substrate.

FIG. 4D is a cross section showing an ion implantation performed on the semiconductor substrate taken along line X-X of FIG. 4A. In FIG. 4D, ion implantation D1b is sequentially performed to implant dopants into the semiconductor substrate 100 to create a continuous doped region 112a, whereby source regions 112 are electrically connected. For example, an ion implantation procedure D1b is preferably performed, using arsenic or phosphorous ions at a doping energy between about 35 to 50 KeV, at a dose between about $1 \times 10^{14}$ and $6 \times 10^{15}$ atoms/cm$^2$, forming heavily doped, N type doped region 112a.

Figure 4E:
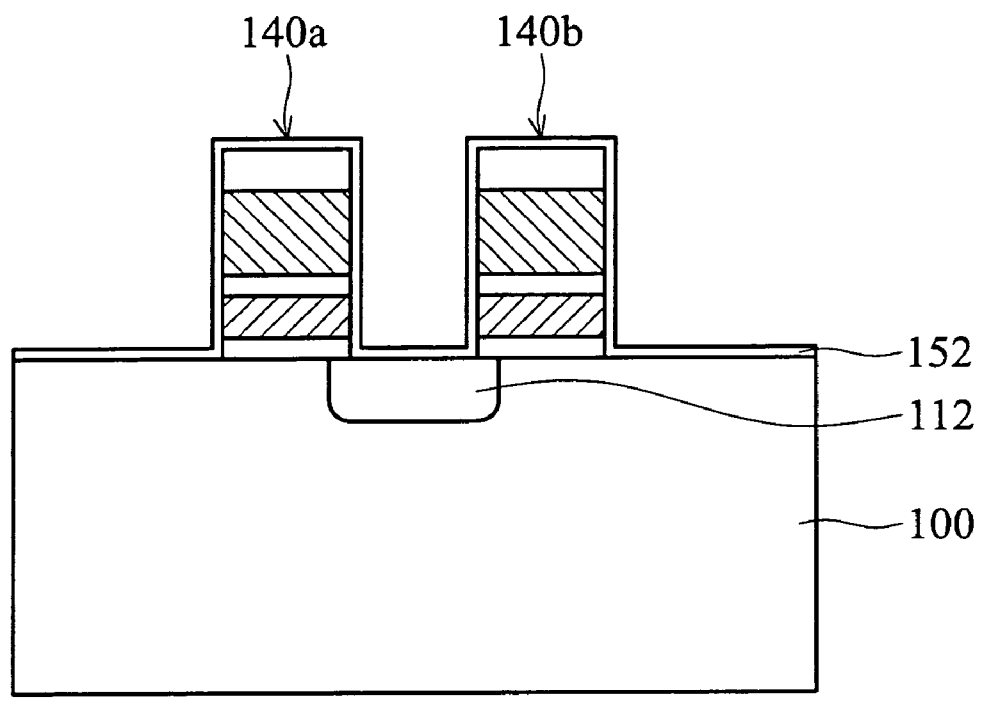
FIG. 4E is a cross section showing formation of an oxide layer on the semiconductor substrate taken along line Y-Y of FIG. 4A.
Figure 4F:
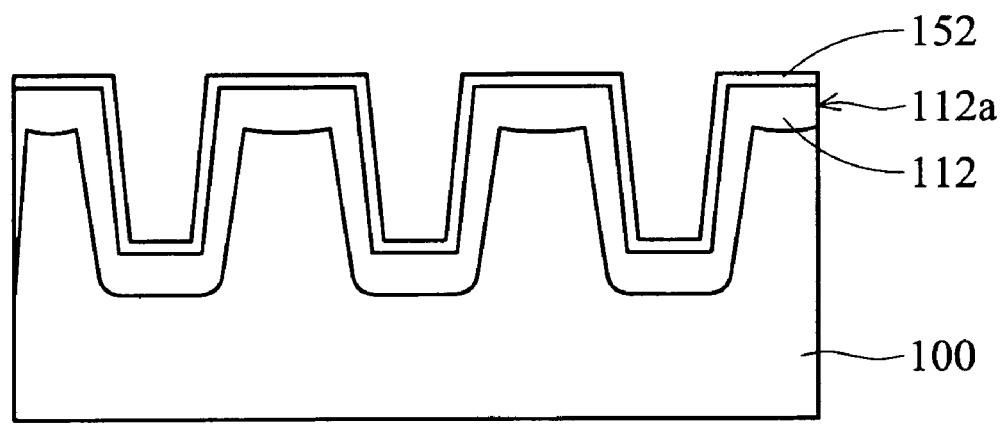
FIG. 4F is a cross section showing formation of an oxide layer on the semiconductor substrate taken along line X-X of FIG. 4A.

FIG. 4E is a cross section showing formation of an oxide layer on the semiconductor substrate taken along line Y-Y of FIG. 4A. FIG. 4F is a cross section of FIG. 4E taken along line X-X. Subsequently, an oxide layer 152 is conformably formed on the semiconductor substrate 100. The oxide layer 152 can be obtained using rapid process oxidation (RPO) or obtained via low pressure chemical vapor deposition (LPCVD) or plasma enhanced chemical vapor deposition (PECVD) procedures.

Figure 4G:
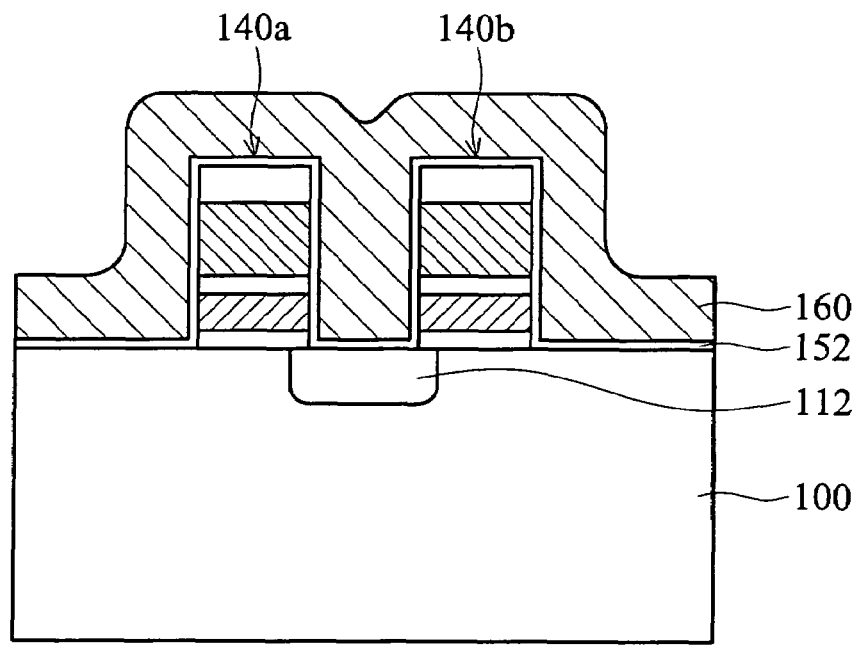
FIG. 4G is a cross section showing deposition of a polysilicon layer on the semiconductor substrate taken along line Y-Y.
Figure 4H:
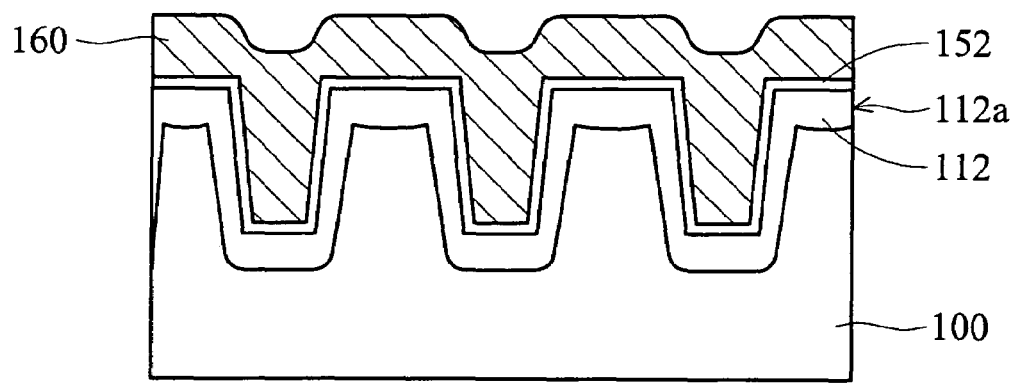
FIG. 4H is a cross section showing deposition of a polysilicon layer on the semiconductor substrate taken along line X-X.

FIG. 4G is a cross section showing deposition of a polysilicon layer on the semiconductor substrate taken along line Y-Y. FIG. 4H is a cross section showing deposition of a polysilicon layer on the semiconductor substrate taken along line X-X. Referring to FIG. 4G, a polysilicon layer 160 is conformably formed on the semiconductor substrate 100. The polysilicon layer 160 can be doped in situ during deposition, via the addition of arsine or phosphine to a silane ambient. Alternatively, the polysilicon layer 160 can be deposited intrinsically then doped via implantation of arsenic or phosphorous ions.

Figure 4I:
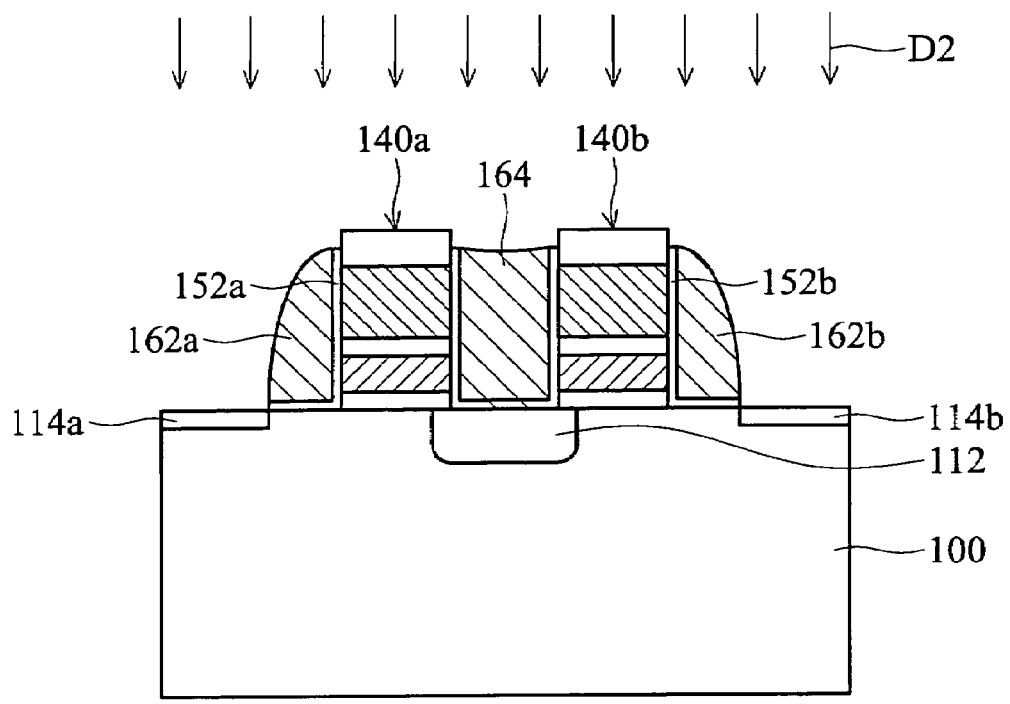
FIG. 4I is a cross section showing creation of source lines and selected gates on the semiconductor substrate.

FIG. 4I is a cross section showing creation of source limes and selected gates on the semiconductor substrate taken along line Y-Y. An anisotropic etching such as RIE is employed to create a source line (SL) 164 between the pair of control gates 140a and 140b along the second direction. Parenthetically, note that the source line 164 does not directly contact the source region 112. A pair of select gates 162a and 162b are simultaneously created on the outer sidewalls of the pair of control gates 140a and 140b along the second direction. Parenthetically, note that the floating gates (FG) are self-aligned with the source line (SL). A pair of light doped drain/source (LDD) 114a and 114b are formed in the semiconductor substrate 100 by ion implantation D2.

Figure 4J:
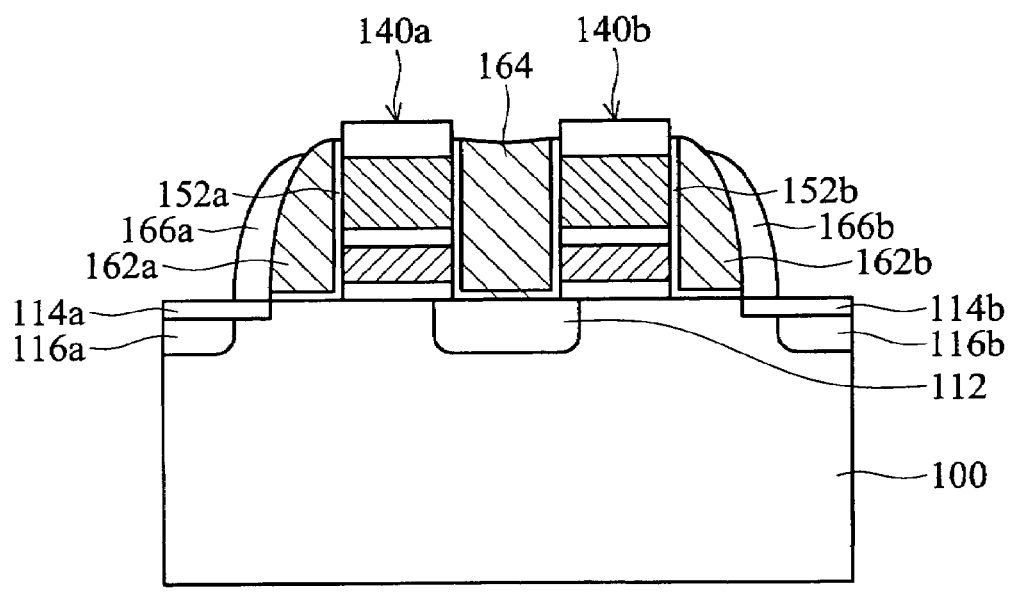
FIG. 4J is a cross section showing formation of dielectric spacers on the select gates.

FIG. 4J is a cross section showing formation of dielectric spacers on the select gates. A dielectric layer is conformably formed on the semiconductor substrate 100 and anisotropically etched partially leaving dielectric spacers 166a and 166b on the select gates 162a and 162b. A critical anisotropic etching back procedure is performed via RIE procedures terminated at the point in which the portion of dielectric spacers 166a and 166b residing on the sidewall of the select gates 162a and 162b.

An ion implantation is subsequently performed to create a pair of highly doped drain/source (HDD) regions 116a and 116b in the semiconductor substrate 100. For example, an ion implantation procedure is preferably performed, using arsenic or phosphorous ions at a doping energy between about 35 to 50 KeV, at a dose between about $1 \times 10^{14}$ and $6 \times 10^{15}$ atoms/cm$^2$, forming heavily doped, N type drain regions 116a and 116b in areas not covered by the control gate and dielectric spacers structures.

Figure 4K:
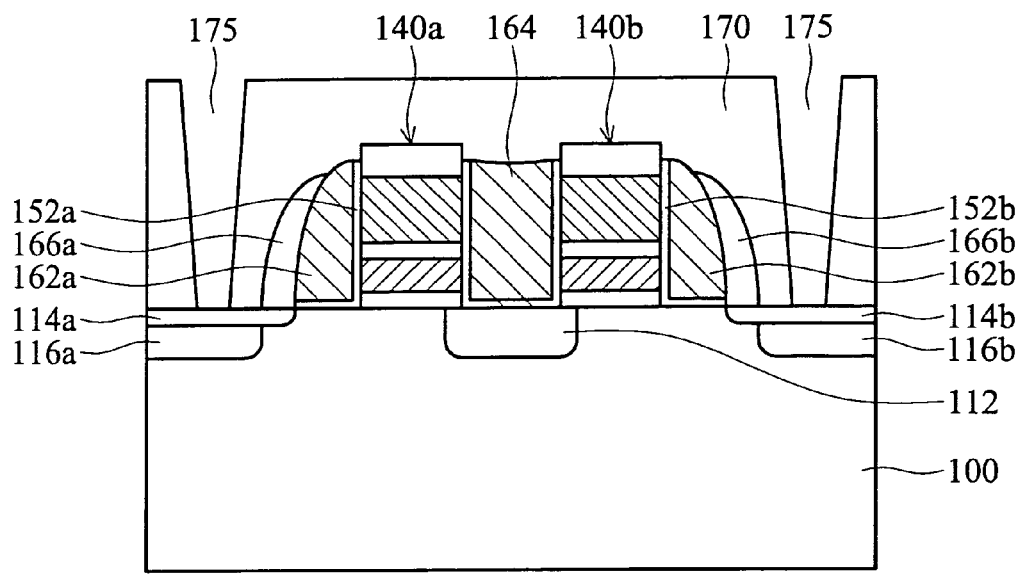
FIG. 4K is a cross section showing formation of an interlayer dielectric (ILD) on the semiconductor substrate.

FIG. 4K is a cross section showing formation of an interlayer dielectric (ILD) on the semiconductor substrate. An ILD layer 170 is patterned forming openings 175 exposing the drain regions 116a and 116b.

Figure 4L:
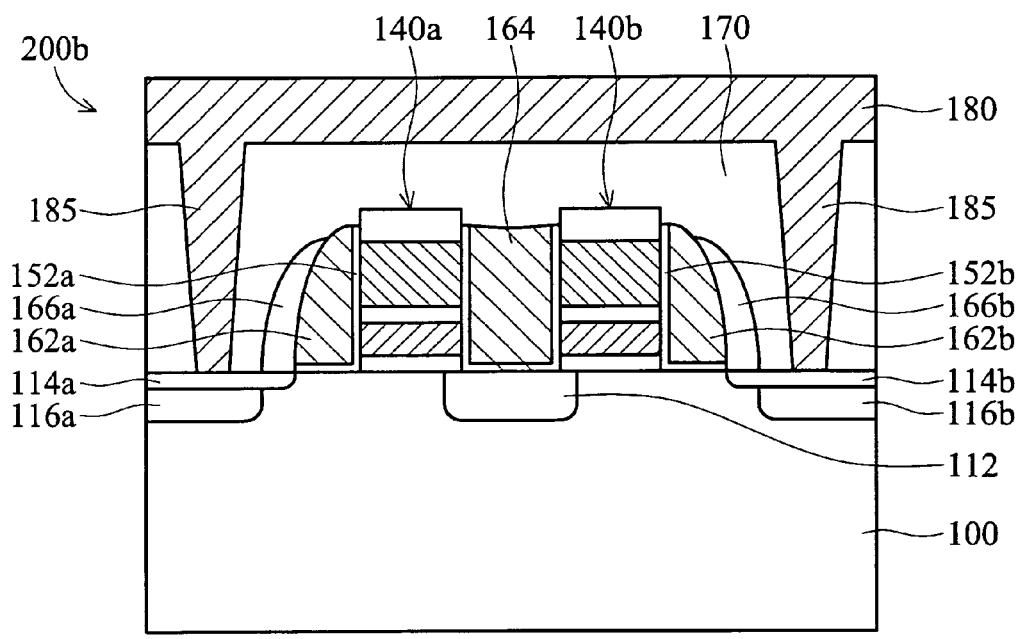
FIG. 4L is a cross section showing metallization of bit lines and contact plugs of the split-gate memory.

FIG. 4L is a cross section showing metallization of bit lines and contact plugs of the split-gate memory. A metal layer 180 is formed on the ILD layer 170 filling the opening 175 to serve as metal contact. For example, metallization is subsequently applied and etched to form bit lines 180 and self-aligned bit line contacts 185.

Figure 4M:
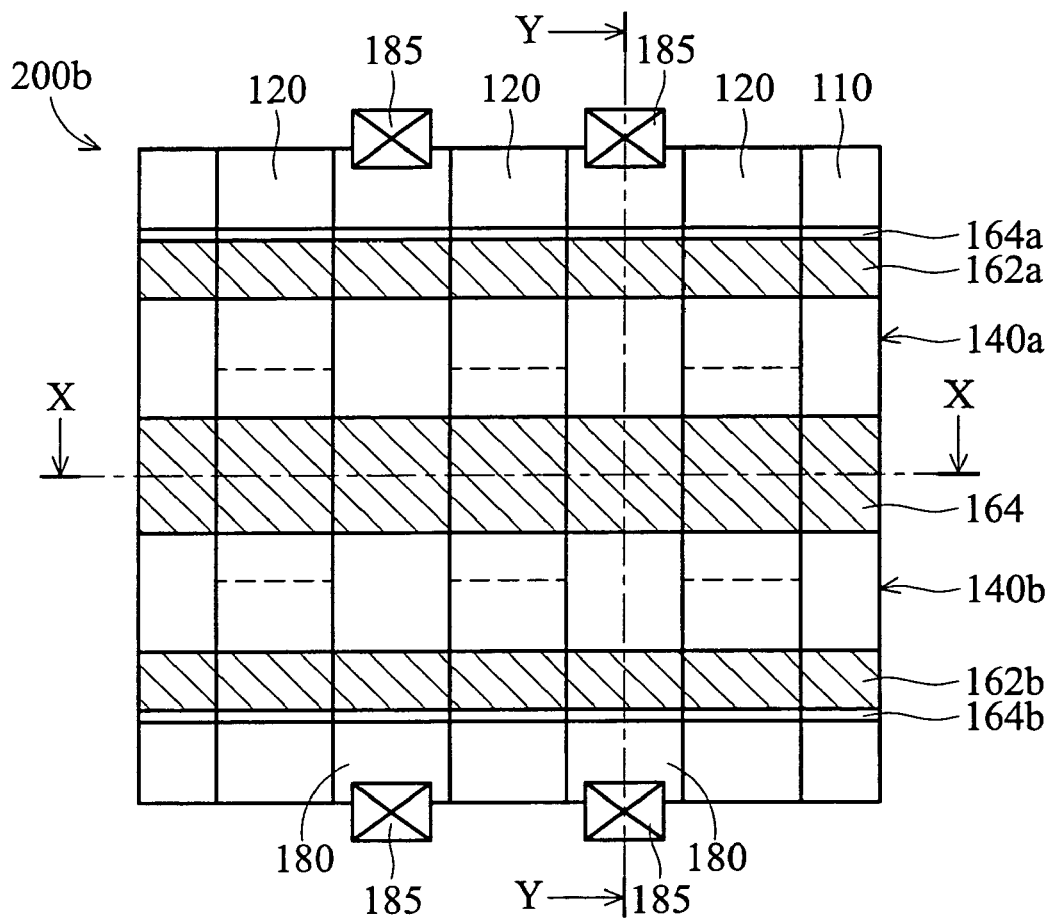
FIG. 4M is a plan view of a split-gate memory cell according to another embodiment of the invention.

Accordingly, in another aspect of the invention, a split-gate nonvolatile memory cell 200b is thus provided. Adjacent isolation regions 120 are formed on a semiconductor substrate 100 along a first direction. The adjacent isolation regions 120 define an active region 110 having a pair of drains 116a, 116b and a source region 112, wherein the top level of the active region 110 is lower than the top level of the isolation regions 120. A pair of floating gates 124 is disposed on the active regions and self-aligned with the isolation regions, whereby the top level of the floating gate is equal to the top level of the isolation regions. A pair of control gates 134 are self-aligned with the floating gates 124 and disposed on the floating gates along a second direction. A source line 164 does not directly contact the source region 112, and is disposed between the pair of control gates 134 along the second direction. The source regions 112 along the second direction are electrically connected by a continuous doped region. A pair of select gates 162a and 162b are disposed on the outer sidewalls of the pair of control gate stacks along the second direction, wherein the split gates are self-aligned with the floating gates, as shown in FIG. 4M.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A split-gate memory cell, comprising:
   a plurality of continuous linear isolation regions formed on a semiconductor substrate along a first direction, between two adjacent isolation regions defining an active region having a pair of drains and a source region along a second direction formed in the semiconductor substrate without disrupting the continuous linear isolation regions;
   a pair of floating gates disposed on the active regions and self-aligned with the isolation regions, wherein a top level of the floating gate is equal to a top level of the isolation regions;

a pair of control gates self-aligned with the floating gates and disposed on the floating gates along a second direction;

a pair of ONO stack layers interposed between the pair of floating gates and the pair of control gates, wherein the pair of floating gates, ONO stack layers, and control gates have equal width along the second direction;

a source line between the pair of control gates along the second direction;

an oxide layer disposed on sidewalls of the pair of floating gates, ONO stack layers, and control gates and with an opening area on the source region; and a pair of select gates disposed on the outer sidewalls of the pair of control gates respectively along the second direction.

2. The split-gate memory cell according to claim 1, wherein a top level of the active regions is lower than the top level of the isolation regions.

3. The split-gate memory cell according to claim 1, wherein the source line is self-aligned with the floating gates along the second direction.

4. The split-gate memory cell according to claim 1, wherein the source line is a polysilicon plug directly connected to the source region.

5. The split-gate memory cell according to claim 1, wherein the source region is electrically connected by a continuous doped region, and wherein the source line does not directly contact the source region.

6. The split-gate memory cell according to claim 1, wherein the pair of split gates is self-aligned with the pair of floating gates.

7. The split-gate memory cell according to claim 1, further comprising dielectric spacers disposed on sidewalls of the pair of select gates.

8. The split-gate memory cell according to claim 1, wherein the first direction is perpendicular to the second direction.

9. A split-gate memory cell, comprising:
a plurality of continuous linear isolation regions formed on a semiconductor substrate along a first direction, between two adjacent isolation regions defining an active region having a pair of drains and a source region along a second direction formed in the semiconductor substrate without disrupting the continuous linear isolation regions;

a pair of floating gates disposed on the active regions and self-aligned with the isolation regions, wherein a top level of the floating gate is equal to a top level of the isolation regions;

a pair of control gates self-aligned with the floating gates and disposed on the floating gates along a second direction;

a pair of ONO stack layers interposed between the pair of floating gates and the pair of control gates, wherein the pair of floating gates, ONO stack layers, and control gates have equal width along the second direction;

a source line directly connected to the source region and disposed between the pair of control gates along the second direction;

an oxide layer disposed on sidewalls of the pair of floating gates, ONO stack layers, and control gates and with an opening area on the source region; and a pair of select gates disposed on the outer sidewalls of the pair of control gates along the second direction.

10. The split-gate memory cell according to claim 9, wherein a top level of the active regions is lower than a top level of the isolation regions.

11. The split-gate memory cell according to claim 9, wherein the source line is self-aligned with the floating gates along the second direction.

12. The split-gate memory cell according to claim 9, wherein the source line comprises a polysilicon plug.

13. The split-gate memory cell according to claim 9, wherein the pair of split gates are self-aligned with the pair of floating gates.

14. The split-gate memory cell according to claim 9, further comprising dielectric spacers disposed on sidewalls of the pair of select gates.

15. The split-gate memory cell according to claim 9, wherein the first direction is perpendicular to the second direction.

* * * * *